United States Patent
Sen et al.

(10) Patent No.: US 7,007,741 B2
(45) Date of Patent: Mar. 7, 2006

(54) CONFORMAL HEAT SPREADER

(75) Inventors: Bidyut K. Sen, Milpitas, CA (US);
Scott Kirkman, Menlo Park, CA (US);
Vadim Gektin, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 5 days.

(21) Appl. No.: 10/273,615

(22) Filed: Oct. 18, 2002

(65) Prior Publication Data

US 2004/0074630 A1  Apr. 22, 2004

(51) Int. Cl.
  *F28F 7/00* (2006.01)
(52) U.S. Cl. .................. 165/46; 165/185; 165/80.4
(58) Field of Classification Search .......... 165/46, 165/80.1, 80.4, 104.19, 80.5, 185, 84; 361/691, 361/698, 700, 704, 751; 257/719; 29/890.03
See application file for complete search history.

(56) References Cited

U.S. PATENT DOCUMENTS

| | | | |
|---|---|---|---|
| 4,072,188 A * | 2/1978 | Wilson et al. | 165/80.4 |
| 4,155,402 A * | 5/1979 | Just | 165/46 |
| 4,546,411 A * | 10/1985 | Kaufman | 361/705 |
| 4,688,147 A | 8/1987 | Ono | |
| 4,933,747 A | 6/1990 | Schroeder | |
| 4,974,119 A | 11/1990 | Martin | |
| 4,997,032 A * | 3/1991 | Danielson et al. | 165/46 |
| 5,126,919 A | 6/1992 | Yamamoto et al. | |
| 5,150,274 A | 9/1992 | Okada et al. | |
| 5,365,402 A | 11/1994 | Hatada et al. | |
| 5,560,423 A | 10/1996 | Larson et al. | |
| 5,608,610 A * | 3/1997 | Brzezinski | 361/704 |
| 5,615,735 A | 4/1997 | Yoshida et al. | |
| 5,685,363 A * | 11/1997 | Orihira et al. | 165/46 |
| 5,720,338 A * | 2/1998 | Larson et al. | 165/46 |
| 5,991,155 A | 11/1999 | Kobayashi et al. | |
| 6,062,299 A * | 5/2000 | Choo et al. | 165/46 |
| 6,219,243 B1 * | 4/2001 | Ma et al. | 361/704 |
| 6,241,005 B1 * | 6/2001 | Risca | 165/46 |
| 6,400,012 B1 | 6/2002 | Miller et al. | |
| 6,631,077 B1 * | 10/2003 | Zuo | 361/699 |
| 2002/0144804 A1 * | 10/2002 | Liang et al. | 165/104.33 |

FOREIGN PATENT DOCUMENTS

| | | |
|---|---|---|
| DE | 4106185 | 9/1992 |
| DE | 19964055 | 7/2001 |
| EP | 0563668 | 3/1993 |
| JP | 03003352 | 1/1991 |
| JP | 2001044350 | 2/2001 |

\* cited by examiner

*Primary Examiner*—Tho Duong
(74) *Attorney, Agent, or Firm*—Meyertons Hood Kivlin Kowert & Goetzel, P.C.; B. Noël Kivlin

(57) ABSTRACT

A heat spreader apparatus for cooling an electronic component and method of attachment. The heat spreader comprises a flexible wall that partially conforms to a non-matching mating surface of the component when pressure is applied to the surface of the flexible wall that is opposite the component. The pressure may be maintained against the flexible wall during use, or released once the flexible wall is maintained in its conforming location by an adhesive.

4 Claims, 6 Drawing Sheets

CONFORMAL HEAT SPREADER

BACKGROUND OF THE INVENTION

1. Field of the Invention

The present invention relates generally to the field of electronic component heat dissipation. More particularly, this invention relates to an improved heat spreader for use with heat-emitting electronic components.

2. Description of the Relevant Art

Heat sinks are commonly attached to electronic components to facilitate heat dissipation from the components. A heat sink is typically composed of a thermally conductive material, such as aluminum, with a plurality of fins or pins on its exposed side. Heat is dissipated from the fins or pins to the surrounding air principally by thermal convection.

Some heat sinks are mounted to, incorporate, or include a thermally conductive element that facilitates distribution of heat from the surface of the component to the heat sink. The intermediary thermally conductive element may be referred to as a "heat spreader." U.S. Pat. No. 5,969,949 issued to Kim et al. discloses a heat spreader slug interposed between an electronic component and a heat sink having a plurality of fins.

Heat sinks may be coupled to a component by a variety of means known to those skilled in the art. For example, the heat sink may be coupled to the component by an adhesive or by various types of retainers such as clamps, brackets, or screws. U.S. Pat. No. 5,615,735 issued to Yoshida et al. discloses an apparatus having a clamp for coupling a heat sink to an integrated circuit package. The clamp has legs that cooperate with mating features on a printed circuit board.

In many cases, the mating surfaces of the component and the heat sink do not match when conventional mounting methods, materials, and assembly practices are used. Such surfaces are referred to herein as "non-matching surfaces." Non-matching surfaces may occur because of irregularities in the mating surfaces (such as roughness or other non-planarity), differences in the contours of the mating surfaces, or misalignment of the mating surfaces. As an example, the mating surface of a component may contain a step or ridge, while the mating surface of a heat sink does not. As another example, a fastener head may protrude slightly from an otherwise flat upper surface of a component, with no compensating feature on the heat sink. Alternatively, poor contact may result where the heat sink is not mounted directly to a component itself, but to another component such as a printed circuit board, and there is a misalignment between the mating surfaces of the component and the heat sink caused by mechanical tolerances among the several parts.

Even if the mating surfaces of a heat sink and component generally conform when the heat sink is initially installed, contact may later be lost or diminished due to loads encountered during assembly, transportation, or use of the system. For example, a heat sink may slip from its originally installed position due to vibration encountered during transportation.

Regardless of the cause, the existence of non-matching surfaces between a component and a heat sink reduces the effectiveness of the heat sink, thereby increasing the operating temperatures of the component. Higher operating temperatures are associated with decreased reliability of electronic components. Accordingly, there is a need for an apparatus and method for improving conformance between the mating surfaces of a heat sink and an electronic component.

SUMMARY OF THE INVENTION

In an embodiment, a heat spreader having a flexible wall is mounted to an electronic component so that the flexible wall faces the mating surface of the component. The flexible wall may be formed of a thermally conductive material that is flexible enough to allow the wall to at least partially conform to a non-matching surface of the component when pressure is applied to the flexible wall on the side of the wall opposite the component. Pressure may be applied using a fluid (either liquid or gas), a tool, or the finger of an assembler. The heat spreader may be coupled to the component by various means including, but not limited to, screws, a clip, or an adhesive between the heat spreader and the component. The flexible wall may partially enclose a chamber in the heat spreader. The chamber may contain a fluid that exerts pressure on the flexible wall.

In one embodiment, the pressure against the flexible wall may be maintained during use of the electronic component so that the wall remains conformed to the surface of the component. For example, while a chamber of a heat spreader is in a pressurized condition, the chamber may be sealed with a valve. Once sealed, the system used to pressurize the chamber may be disconnected, and the component placed into operation. In certain embodiments, a thermal interface material, such as thermal grease, phase change material or thermally conductive adhesive, may be disposed between the component and the flexible wall to facilitate heat transfer from the component to the body of the heat spreader. Alternatively, a heat spreader and component may be directly coupled, with no thermal interface material between the heat spreader and the component.

In another embodiment, pressure may be maintained on the flexible wall only as long as necessary to allow an adhesive between heat spreader and component to cure. After the adhesive has cured, the flexible wall will be maintained against the mating surface of the component by the adhesive even if the fluid pressure against the flexible wall is removed.

In certain embodiments, a thermal interface material, such as thermal grease, phase change material or thermally conductive adhesive, may be disposed between mating surfaces to facilitate heat transfer from the component to the body of the heat spreader. In other embodiments, mating surfaces may contact each other directly, with no thermal interface material between the heat spreader and the component.

In an embodiment, a heat spreader including a flexible wall may incorporate a heat pipe. Working elements of the heat pipe, such as a working fluid and a wick, may be disposed in a chamber. In another embodiment, a single heat spreader including a flexible wall may be coupled to a plurality of components. In still another embodiment, a heat spreader including a flexible wall may be incorporated into a computer system to facilitate heat transfer from one or more heat-emitting components of the system.

BRIEF DESCRIPTION OF THE DRAWINGS

Other objects and advantages of the invention will become apparent upon reading the following detailed description and upon reference to the accompanying drawings in which.

Figure 1:
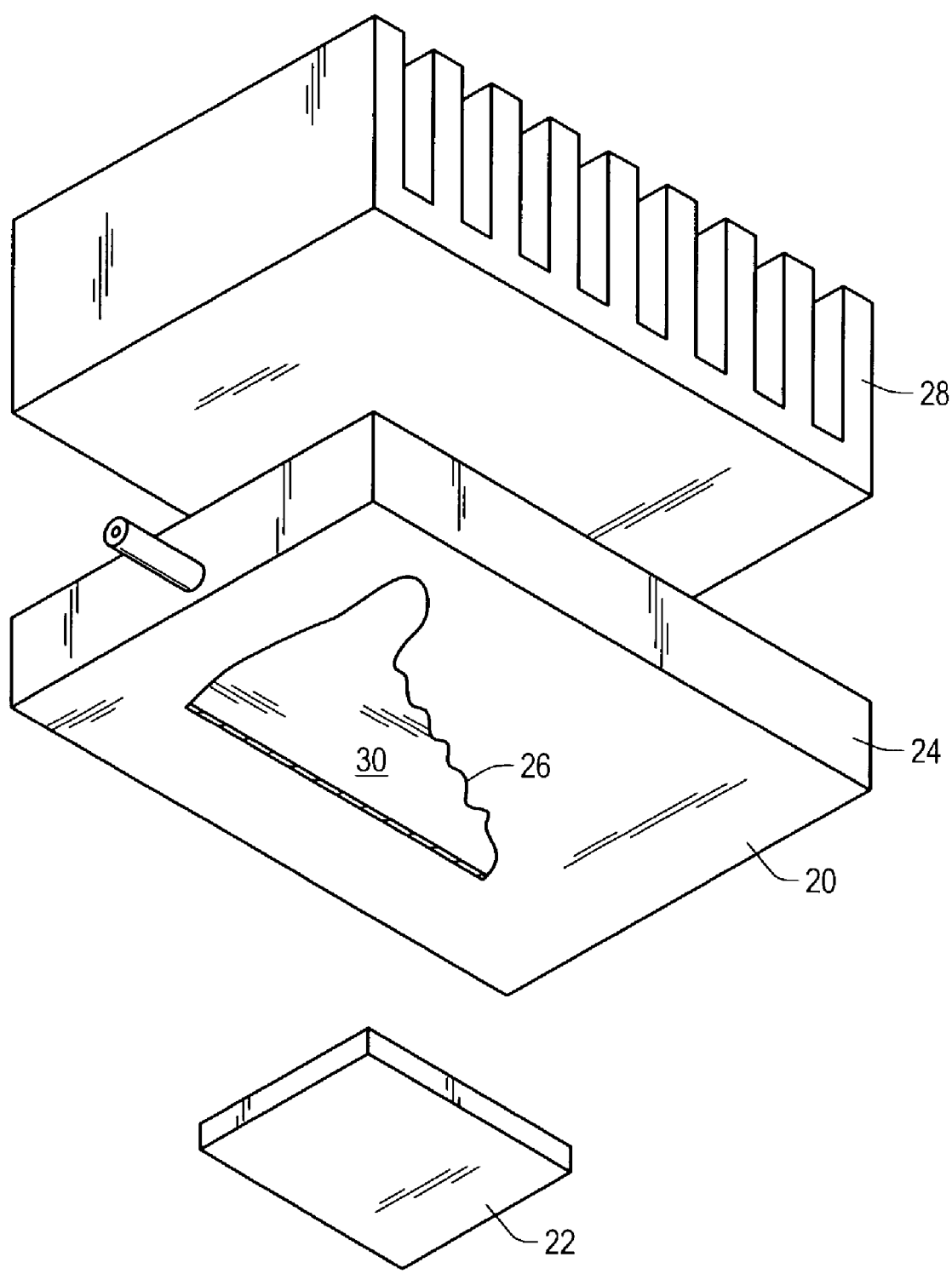
FIG. 1 shows an exploded perspective view of a heat spreader and an electronic component.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Referring to FIG. 1, a heat spreader 20 may be mounted to a component 22 to facilitate cooling of the component. Component 22 may be any electronic component that produces heat during use, including, but not limited to, a surface-mounted integrated circuit, dual in-line memory module, or a single transistor housed in a can. Component 22 may be mounted to a printed circuit board (not shown). The package design of component 22 may be of a lidded or lidless type. Electrical connection of component 22 may be via ball grid array or non-ball grid array. Heat spreader 20 may be mounted either directly to component 22 or to another element, such as a printed circuit board to which component 22 is also mounted.

Heat spreader 20 may include a body 24 and a flexible wall 26. As used herein, "flexible" means that at least a portion of the wall will deflect when pressure is applied to a surface of the wall. Flexible wall 26 may face component 22 and be of a thermally conductive material. Examples of materials that may be used to form flexible wall include, but are not limited to, copper or aluminum. Extended members such as fins or pins (not shown) for increasing the exposed surface area of the heat spreader 20 may be integral features of body 24. Alternatively, extended members may be part of a separate heat sink 28 that is coupled to a heat spreader 20 by screws, rivets, an adhesive, or other means known to those skilled in the art, to form a heat transfer device.

Figure 2:
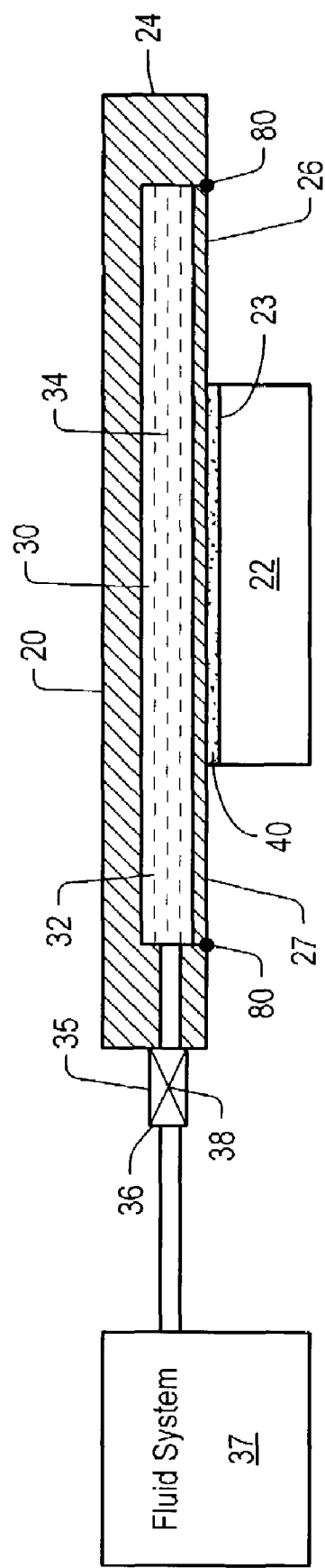
FIG. 2 shows a cross-sectional view of a heat spreader having a chamber positioned on a component.

In some embodiments, a chamber 30 may be disposed within body 24. As shown in FIG. 2, chamber 30 may be partially defined by flexible wall 26. Chamber 30 may contain a fluid 32. Fluid 32 may be a liquid, a gas, or a combination of liquid and gas. Fluid 32 may be a fluid that has a relatively high thermal conductivity. Examples of such fluids include, but are not limited to, helium or water. A non-rigid, thermally conductive solid material, such as copper in the form of a mesh 34, may be enclosed within chamber 30. Fluid 32 and mesh 34 may facilitate heat transfer from component 22. Fluid 32 may be introduced and vented through an inlet 36. Inlet 36 may include a feature such as a tube stub 35 or fluid fitting (not shown) for connection with a fluid system 37 configured to introduce fluid into the chamber. A valve 38 may be placed between the mouth of inlet 36 and chamber 30 to control flow into and out of the chamber.

Under some conditions, mating surface 23 of component 22 and mating surface 27 of flexible wall 26 will be substantially non-matching with respect to each other when heat spreader 20 is initially installed. As discussed above, a non-matching condition of the mating surfaces may be due to misalignment of the components or to non-planarity of one or more of the mating surfaces.

To improve conformance of mating surfaces 23 and 27, pressure may be applied to flexible wall 26 on the side of the wall opposite component 22 to cause the wall to bulge away from body 24 and toward surface 23. Pressure may be applied by means of a fluid (e.g., water or helium gas) or by mechanical means (e.g., a tool). Displacement of flexible wall 26 may cause mating surface 27 to at least partially conform to mating surface 23.

Conformance of the flexible wall of the heat sink to the component may increase the surface area of the heat sink that is in contact with the surface of the component, thereby facilitating heat transfer from the component. The pressure of the flexible wall against the surface of the component may reduce the thermal contact resistance at the junction of the heat spreader and the component, thereby facilitating heat transfer from the component. The pressure of the wall against the component may also inhibit slippage of the heat spreader from its installed location on the component.

In certain embodiments, a thermal interface material may be disposed between mating surfaces to facilitate heat transfer between the elements of the system. The thermal interface material may include, but is not limited to, a thermal grease, phase change material, or thermally conductive adhesive. In other embodiments, mating surfaces may contact each other directly, with no thermal interface material between elements.

Figure 3:
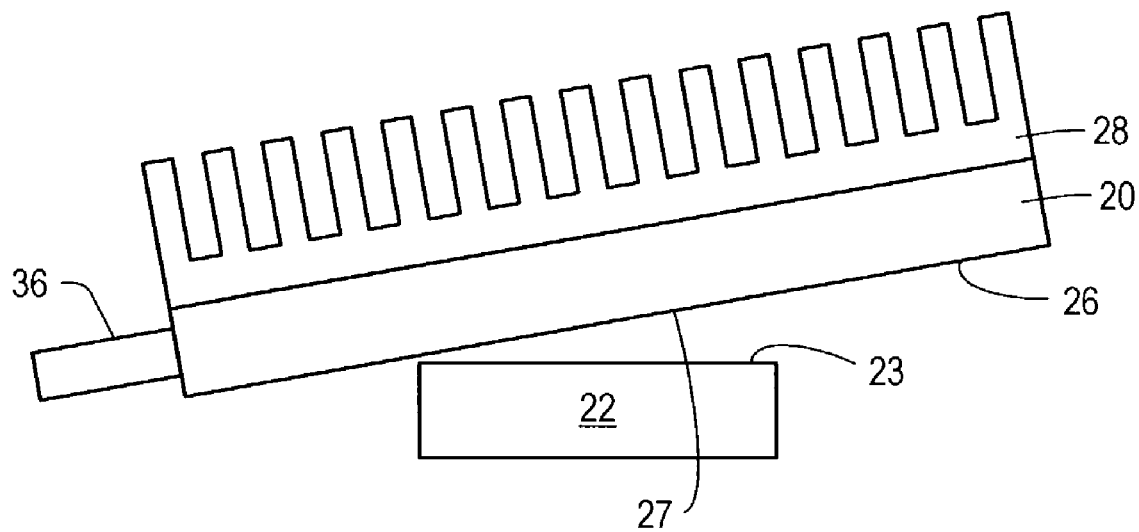
FIG. 3 shows a heat spreader as initially installed on a component, wherein the mating surfaces of the heat spreader and the component do not match.
Figure 4:
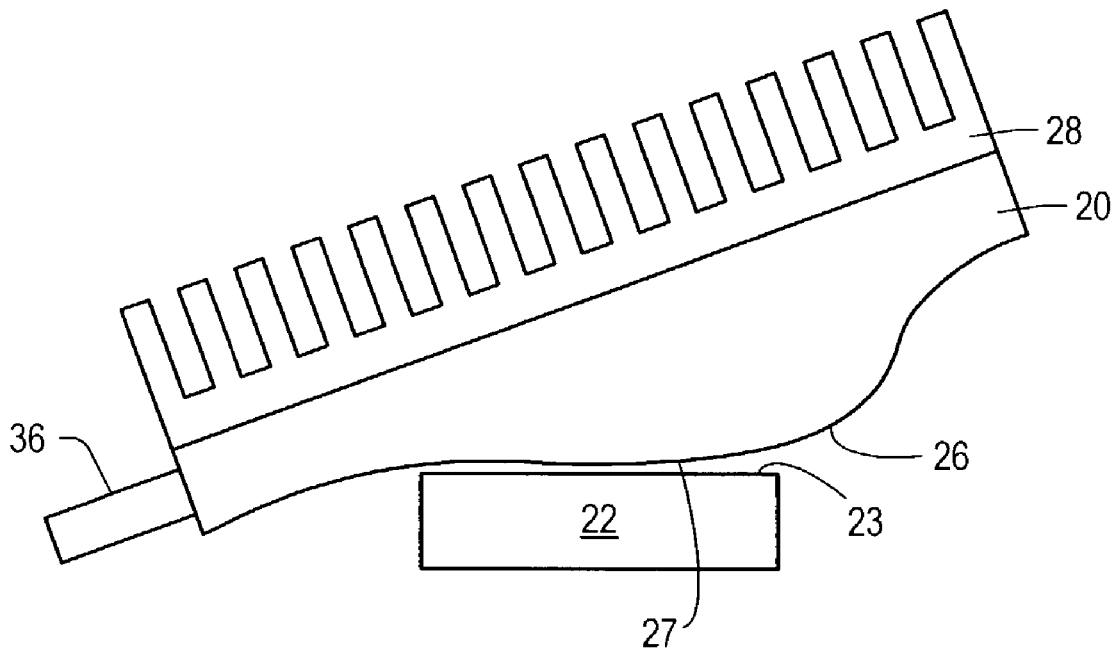
FIG. 4 shows a heat spreader while the flexible wall of the heat spreader is subjected to pressure, wherein the flexible wall of the heat spreader at least partially conforms to the mating surface of the component.

FIGS. 3 and 4 depict an embodiment in which flexible wall 26 of heat spreader 20 is forced against non-matching mating surface 23 of component 22 to cause flexible wall 26 to at least partially conform to mating surface 23. In FIGS. 3 and 4, relative misalignment of the parts and displacement of the flexible wall are greatly exaggerated for illustrative purposes. FIG. 3 shows the relationship of component 22 and heat spreader 20 as initially installed. Mating surfaces 23 and 27 are misaligned with respect to each other, and thus are only in contact for a small portion of component 22. In contrast, FIG. 4 shows the relationship of component 22 and heat spreader 20 while pressure is applied to flexible wall 26. Under pressure, flexible wall 26 may bulge toward the surface 23, causing mating surface 27 to at least partially conform to mating surface 23. Better conformance of the mating surfaces may cause improved heat transfer from component 22. Displacement along flexible wall 26 resulting from the pressure on the wall may vary depending on installation conditions. For a typically sized component (e.g., approximately 20 mm in length), maximum displacement of flexible wall 26 may be in the range of 50–100 microns.

In one embodiment, the pressure in chamber 30 may be maintained during use of component 22 so that flexible wall 26 remains conformed to the surface 23. For example, while chamber 30 is in a pressurized condition, the chamber may be sealed by valve 38. Alternatively, tube stub 35 may be crimped shut to seal chamber 30 while the chamber is pressurized by the fluid system. In either case, fluid system 37 may be disconnected after the chamber is sealed.

In another embodiment, pressure may be maintained on flexible wall 26 only as long as necessary to allow an adhesive between heat spreader 20 and component 22 to cure, then removed. In such an embodiment, an adhesive 40 may be applied to one or more of surfaces 23 and 27 before heat spreader 20 is installed on component 22. Then, before adhesive 40 has cured, heat spreader 20 may be installed and pressure applied to flexible wall 26. After adhesive 40 has cured, flexible wall 26 will be maintained in conformance with mating surface 23 by adhesive 40, even if the pressure against flexible wall 26 is removed.

Figure 5:
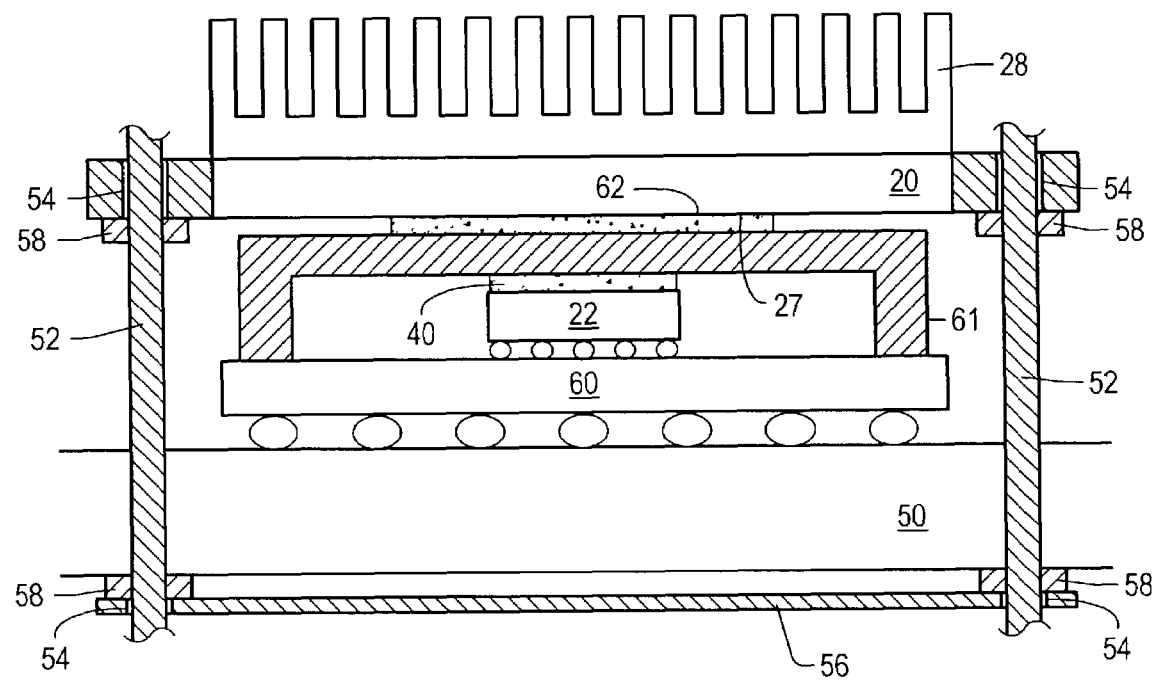
FIG. 5 shows a cross-sectional view of a heat spreader coupled to a lidded case by means of screws attached to a printed circuit board.

Heat spreader 20 may be coupled to component 22 by a variety of methods. Such means include, but are not limited to, an adhesive 40 or a retainer. Adhesive 40 may be any of various thermally conductive epoxies or other bonding materials as are well known to those skilled in the art. A retainer may be any of various retaining elements known to those skilled in the art, including, but is not limited to, a clamp, a clip, a bracket, or one or more screws. FIG. 5 shows a heat spreader 20 mounted to a printed circuit board 50 by a plurality of screws 52. Screws 52 may extend through a matching pattern of holes 54 in printed circuit board 50 and heat spreader 20. Screws 52 may be affixed to a bolster plate 56, and the parts maintained in relative position to each other by nuts 58.

Figure 6:
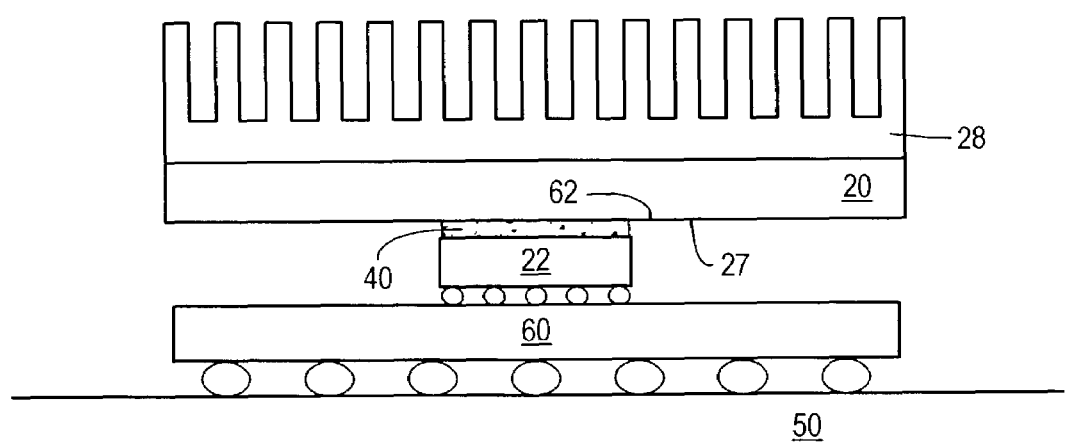
FIG. 6 shows a heat spreader coupled to a component in a lidless package.

Heat spreader 20 may be used in conjunction with lidded or lidless component packaging. In the embodiment shown in FIG. 5, a component 22 and a lid 61 are mounted to an electronic package 60, which is in turn coupled to a printed circuit board 50. Lid 61 includes a mating surface 62. Heat spreader 20 is coupled to lid 61 via screws 52. An adhesive 40 that is thermally conductive or another thermal interface material may be disposed between mating surfaces 27 and 62 and/or between component 22 and lid 61. Alternatively, heat spreader 20 may be mounted to a component of a lidless package. For example, as depicted in FIG. 6, component 22 is mounted to electronic package 60, and heat spreader 20 is mounted directly to component 22.

Figure 7:
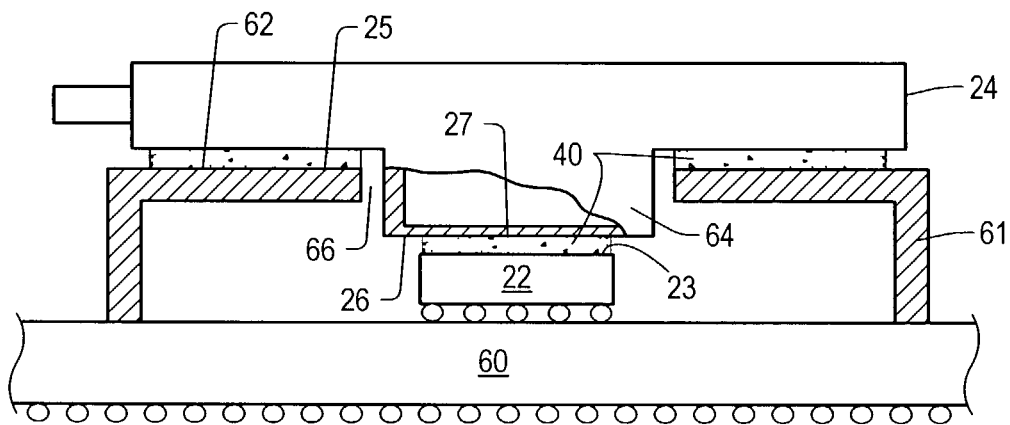
FIG. 7 shows a partial cross-sectional view of a heat spreader coupled to a lidded case in which the lid includes an aperture for a heat spreader boss.

In an embodiment, a lid for an electronic package may contain an aperture to enable direct contact between an internally mounted component and the heat spreader. Referring to FIG. 7, heat spreader 20 may include a boss 64 that extends through an aperture 66 in lid 61. Mating surface 27 of flexible wall 26 may face mating surface 23 of component 22, while mating surface 25 of body 24 may face mating surface 62 of lid 61. Adhesive 40 or other thermal interface material may be applied to one or more of the mating surfaces to facilitate heat transfer from the component 22 and from electronic package 60.

Figure 8:
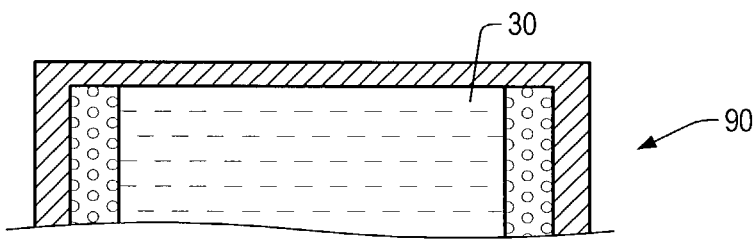
FIG. 8 shows a partial cross-sectional view of a heat spreader incorporating a heat pipe.
Figure 8:
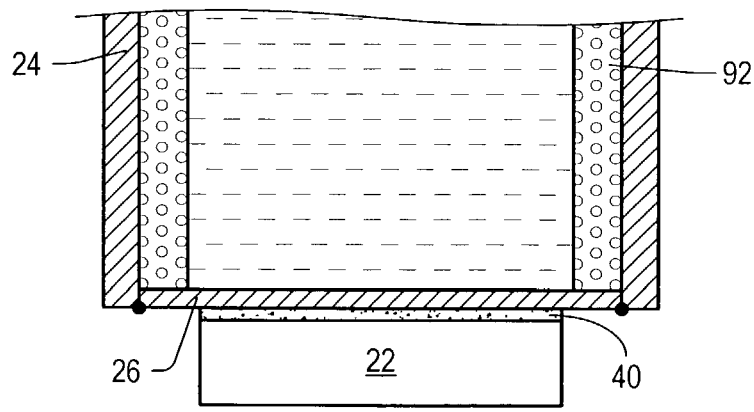

In an embodiment, heat spreader 20 may incorporate a heat pipe. As shown in FIG. 8, working elements of a heat pipe 90, such as a working fluid and a wick 92, may be disposed in chamber 30. U.S. Pat. No. 4,912,548 issued to Shanker et al. describes a heat pipe that is coupled directly to a conventional semiconductor device package.

Figure 9:
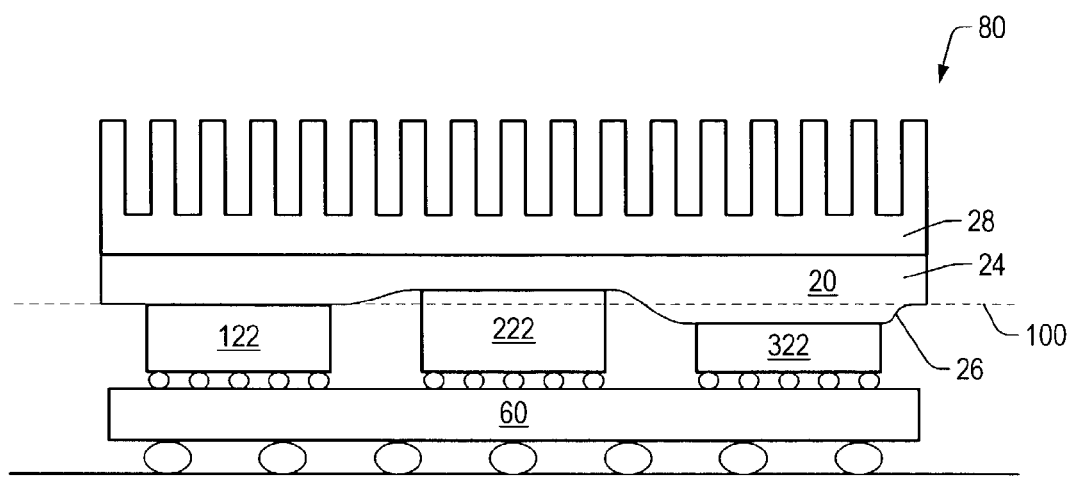
FIG. 9 shows a side view of a heat spreader coupled to a plurality of components.

In an embodiment, a single heat spreader may be coupled to a plurality of components. FIG. 9 shows a heat transfer device 80 that includes a heat spreader 20 and a heat sink 28. Heat transfer device 80 may be coupled to components 122, 222, and 322. Components 122, 222, and 322 may be mounted on an electronic package 60. As an alternative, components 122, 222, and 322 may each be mounted to a separate electronic package. As another alternative, components 122, 222, and 322 may be mounted on a common circuit board.

In FIG. 9, components 122, 222, and 322 are depicted as each having a different installed height. In particular, the installed height of component 222 is greater than the installed height of component 122. The installed height of component 322 is less than the installed height of component 122. A flexible wall 26 of heat spreader 20 may conform to the upper surface of one or more of components 122, 222, and 322 (the differences in installed heights of the components and corresponding displacement of the flexible wall in FIG. 9 being exaggerated for illustrative purposes). For example, flexible wall 26 may be displaced out of plane 100 toward the body 24 of heat spreader 20 near taller component 222. Flexible wall 26 may be displaced out of plane 100 away from the body 24 of heat spreader 20 near shorter component 322. Flexible wall 26 may be substantially undisplaced near component 122. Conformance of flexible wall 26 to the components may facilitate heat transfer from the components.

Figure 10:
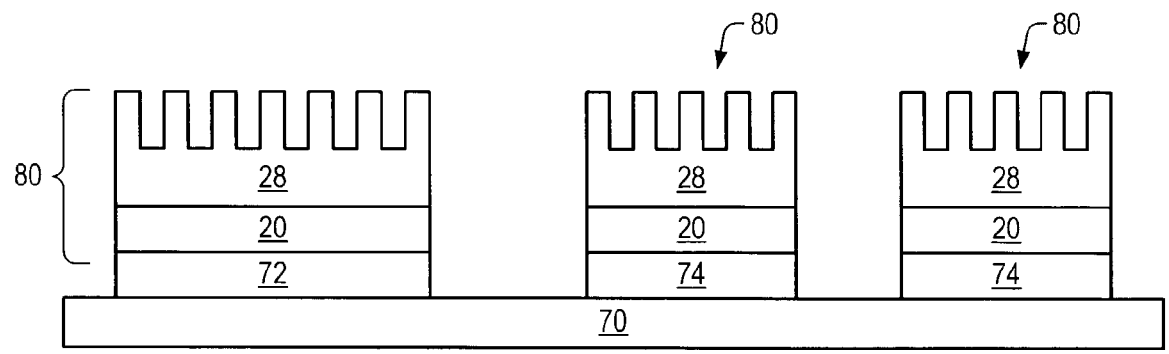
FIG. 10 shows a block diagram of a computer system that incorporates one or more heat spreaders.

In an embodiment, heat spreader 20 may be incorporated into a computer system to facilitate heat transfer from one or more electronic components of the system. FIG. 10 is a high-level component diagram of such a computer system. Computer system 70 may include a central processing unit 72 and other having electronic components 74. Heat transfer devices 80 may be coupled to central processing unit 72 and to electronic components 74. Heat transfer devices 80 include a heat spreader 20, as described herein, and a heat sink 28.

Referring once again to FIG. 2, body 24 may be of a thermally conductive material such as aluminum, copper or steel. Flexible wall 26 may be of a thermally conductive material that is thin enough flex when pressure is applied to a surface of the flexible wall, such as aluminum or copper shim stock. The thickness of copper shim stock may be in the range of 25–75 microns. Flexible wall 26 may be coupled to body 24 by various means known to those skilled in the art, such as by means of solder 80 or by brazing. Tube stub 35 may be soldered or brazed to body 24. Adhesive 40 may be one of various bonding materials known to those skilled in the art, including, but not limited to, a thermally conductive epoxy or glue.

Fluid system 37 may be a system that is capable of supplying a fluid to apply pressure to flexible wall 26. Fluid system 37 may include a tank of pressurized gas or a water pump, as appropriate, a flow regulator, pressure gauge, and tubing (none of which are shown in FIG. 2). Fluid system 37 may be disconnected from heat spreader 20 during operation of component 22.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of attaching a heat spreader to one or more electronic components, the heat spreader comprising a body and a flexible wall enclosing a chamber in the body, the method comprising:

coupling the heat spreader to at least one of the one or more electronic components; and providing a fluid system configured to supply fluid to the chamber;

introducing a fluid to the chamber with the fluid system to pressurize the chamber while the heat spreader is coupled to the at least one electronic component such that the flexible wall at least partially conforms to a surface of the electronic component;

maintaining the flexible wall in conformance to the surface of the component while the fluid system is disconnected from the heat spreader, wherein the heat spreader is coupled to at least one electronic component with an adhesive disposed between the flexible wall and the surface of the electronic component, wherein maintaining the flexible wall in conformance to the surface of the component comprises allowing the adhesive to substantially cure and at least partially reducing the pressure on the flexible wall after allowing the adhesive to substantially cure.

2. The method of claim 1, wherein the heat spreader is coupled to at least two electronic components.

3. The method of claim 1, wherein the heat spreader is coupled to at least two electronic components, and wherein the flexible wall at least partially conforms to a surface of at least two of the electronic components when pressure is applied to the flexible wall.

4. The method of claim 1, wherein the mating surfaces of the heat spreader and the at least one electronic component are misaligned with respect to each other when the heat spreader is initially coupled to the at least one electronic component.

* * * * *